United States Patent
Li

(10) Patent No.: US 9,833,065 B2
(45) Date of Patent: Dec. 5, 2017

(54) MULTIPURPOSE PROTECTIVE AND SUPPORT DEVICE FOR FLAT PANEL ELECTRONIC EQUIPMENT

(71) Applicant: You Li, Zhejiang (CN)

(72) Inventor: You Li, Zhejiang (CN)

( * ) Notice: Subject to any disclaimer, the term of this patent is extended or adjusted under 35 U.S.C. 154(b) by 0 days.

(21) Appl. No.: 15/112,154

(22) PCT Filed: Jul. 30, 2014

(86) PCT No.: PCT/CN2014/083274
§ 371 (c)(1),
(2) Date: Jul. 15, 2016

(87) PCT Pub. No.: WO2015/109809
PCT Pub. Date: Jul. 30, 2015

(65) Prior Publication Data
US 2016/0324310 A1  Nov. 10, 2016

(30) Foreign Application Priority Data
Jan. 22, 2014 (CN) .......................... 2014 1 0029556

(51) Int. Cl.
*G06F 1/16* (2006.01)
*A47B 23/06* (2006.01)
(Continued)

(52) U.S. Cl.
CPC .............. *A47B 23/06* (2013.01); *A45C 11/00* (2013.01); *A47B 23/04* (2013.01); *F16M 11/10* (2013.01); *G06F 1/1626* (2013.01);
*G06F 1/1635* (2013.01); *H01L 31/049* (2014.12); *H02S 30/20* (2014.12); *H02S 40/38* (2014.12);
(Continued)

(58) Field of Classification Search
CPC combination set(s) only.
See application file for complete search history.

(56) References Cited

U.S. PATENT DOCUMENTS 6,196,405 B1 * 3/2001 Kambouris .......... B65D 43/164
206/701
7,911,774 B2 * 3/2011 Nakanishi ......... G02F 1/133308
29/592.1
(Continued)

FOREIGN PATENT DOCUMENTS

CN           2245786 Y    1/1997
CN           2300942 Y    12/1998
(Continued)

*Primary Examiner* — Lisa Lea Edmonds

(57) ABSTRACT

A multipurpose protective and support device for a flat panel electronic equipment includes a protective cover (1) and two strip-shaped slide rails (2)/slide shafts (3) respectively fixed at a left side and a right side of the flat panel electronic equipment. The protective cover includes a main panel (10), two side plates (11) are respectively located at a left side and a right side of the main panel. Two side shafts (3)/two strip-shaped slide grooves (4) are respectively located at an inner side of one end of the side plates, the side shafts (3) are respectively inserted into the strip-shaped slide rails (2) or the strip-shaped slide groove (4), the slide shafts (3) on the protective cover or the flat panel electronic equipment are able to respectively rotate or slide within the strip-shaped slide rails (2) or the strip-shaped slide grooves (4).

20 Claims, 8 Drawing Sheets

(51) Int. Cl.
   *H01L 31/049*   (2014.01)
   *H02S 30/20*    (2014.01)
   *H02S 40/38*    (2014.01)
   *A45C 11/00*    (2006.01)
   *A47B 23/04*    (2006.01)
   *F16M 11/10*    (2006.01)
   *H02J 7/35*     (2006.01)

(52) U.S. Cl.
   CPC ..... *A45C 2011/003* (2013.01); *A45C 2200/15* (2013.01); *F16M 2200/022* (2013.01); *G06F 2200/1633* (2013.01); *H02J 7/35* (2013.01); *Y02E 10/50* (2013.01)

(56) References Cited

U.S. PATENT DOCUMENTS

| | | | | |
|---|---|---|---|---|
| 8,081,450 B2* | 12/2011 | Guo | ............ | H04M 1/0237 361/679.01 |
| 8,149,571 B2* | 4/2012 | Yang | ............ | G06F 1/1616 361/679.01 |
| 8,248,787 B2* | 8/2012 | Peng | ............ | H04M 1/0208 348/376 |
| 8,385,063 B2* | 2/2013 | Zhu | ............ | G06F 1/1624 292/251.5 |
| 8,503,174 B2* | 8/2013 | Fyke | ............ | H04M 1/0237 292/251.5 |
| 8,605,421 B2* | 12/2013 | Verschoor | ............ | G06F 1/1652 361/679.21 |
| 2002/0071550 A1* | 6/2002 | Pletikosa | ............ | G06F 1/1626 379/433.01 |
| 2005/0264988 A1* | 12/2005 | Nicolosi | ............ | G06F 1/1626 361/679.44 |
| 2007/0217129 A1* | 9/2007 | Chuang | ............ | G06F 1/162 361/679.55 |
| 2014/0118929 A1* | 5/2014 | Leung | ............ | G06F 1/162 361/679.55 |
| 2016/0278493 A1* | 9/2016 | Shibahara | ............ | G06F 1/1626 |

FOREIGN PATENT DOCUMENTS

| | | |
|---|---|---|
| CN | 201741080 U | 2/2011 |
| CN | 203025612 U | 6/2013 |
| CN | 103760954 A | 4/2014 |

* cited by examiner

MULTIPURPOSE PROTECTIVE AND SUPPORT DEVICE FOR FLAT PANEL ELECTRONIC EQUIPMENT

CROSS REFERENCE OF RELATED APPLICATION

This is a U.S. National Stage under 35 U.S.C 371 of the International Application PCT/CN2014/083274, filed Jul. 30, 2014, which claims priority under 35 U.S.C. 119(a-d) to CN 201410029556.3, filed Jan. 22, 2014.

BACKGROUND OF THE PRESENT INVENTION

Field of Invention

The present invention relates to a technical field of electronic equipments, and more particularly to a multipurpose protective and support device for a flat panel electronic equipment.

Description of Related Arts

Currently, the flat panel electronic equipment has small volume, is easy to carry and use, and has technological and stylish appearance, so that it has become a very popular technology product. However, compared with the traditional notebook computer, the flat panel electronic equipment has some shortcomings as follows. Firstly, its keyboard is a touch screen virtual keyboard, so the input speed is slower, which does not conform to people's computer usage habits which have been established for a long term. Secondly, it can only be hold by hands or put on a table, and can not stand itself at a certain angle, so that people are unable to keep a very pleasure posture to watch.

Aiming at the above mentioned problems, the prior arts adopt some solutions, such as installing a support frame on the flat panel electronic equipment. However, after installing the support frame, the flat panel electronic equipment is complicate in structure, so the recognition of consumers is not high.

SUMMARY OF THE PRESENT INVENTION

An object of the present invention is to provide a multipurpose protective and support device for a flat panel electronic equipment, which combines two functions of protection and support, so that while closing the protective and support device, a screen of the flat panel electronic equipment is protected; and while opening the protective and support device, the flat panel electronic equipment is supported to stand, or after being opened, the protective and support device is attached to a back of the flat panel electronic equipment, thereby achieving advantages of comfortable and convenient usage and functional diversification.

The object of the present invention is achieved as follows.

A multipurpose protective and support device for a flat panel electronic equipment, comprises: a protective cover and two strip-shaped slide rails/slide shafts respectively fixed at a left side and a right side of the flat panel electronic equipment, wherein the protective cover comprises a main panel, two side plates are respectively located at a left side and a right side of the main panel, two side shafts/two strip-shaped slide grooves are respectively provided at an inner side of one end of the side plates, the side shafts are respectively inserted into the strip-shaped slide rails or strip-shaped slide grooves, the slide shafts on the protective cover or the flat panel electronic equipment are able to respectively rotate or slide within the strip-shaped slide rails or the strip-shaped slide grooves.

As a first embodiment of the present invention, a multipurpose protective and support device for a flat panel electronic equipment, comprises: a protective cover and two strip-shaped slide rails respectively fixed at a left side and a right side of the flat panel electronic equipment, wherein the protective cover comprises a main panel, two side plates are respectively located at a left side and a right side of the main panel, the two side shafts are respectively located at an inner side of one end of the side plates, the side shafts are respectively inserted into the strip-shaped slide rails, the slide shafts on the protective cover are able to respectively rotate or slide within the strip-shaped slide rails.

As an another embodiment of the present invention, a multipurpose protective and support device for a flat panel electronic equipment, comprises: a protective cover and two slide shafts respectively fixed at a left side and a right side of the flat panel electronic equipment, wherein the protective cover comprises a main panel, two side plates are respectively located at a left side and a right side of the main panel, two strip-shaped slide grooves are respectively provided at an inner side of one end of the side plates, the side shafts are respectively inserted into the strip-shaped slide grooves, the slide shafts on the flat panel electronic equipment are able to respectively rotate or slide within the strip-shaped slide grooves.

In the above multipurpose protective and support device for a flat panel electronic equipment, a bent end cap is located at a front side of the protective cover, and a protrusion, which is capable of elastically clamping with the flat panel electronic equipment, is located on the end cap.

In the above multipurpose protective and support device for a flat panel electronic equipment, two locking mechanisms are respectively located on the side plates, wherein the slide shafts are respectively located at the inner side of the side plates, two locking slide slots are respectively provided at an outer side thereof, one end of one locking slide slot and a corresponding slide shaft are respectively located at two opposite sides of a corresponding side plate, two slide blocks are respectively installed within the locking slide slots, two fastening heads, which are capable of respectively squeezing and contracting within the locking slide slots, are respectively located on the slide blocks; when one slide block slides to one end of the corresponding locking slide slot, the corresponding fastening head produces a rebounding force to squeeze the corresponding slide shaft for tightly clamping the corresponding strip-shaped slide rail, thereby a rotation or sliding of the slide shaft relatively to the strip-shaped slide rail is limited through a friction force.

In the above multipurpose protective and support device for a flat panel electronic equipment, two U-shaped notches are respectively provided at an inner side of the side plates, two press plates, which are capable of being respectively squeezed by the fastening heads or the slide blocks to incline inwardly, are respectively formed within the notches, the slide shafts are respectively located on the press plates, and two rollers, which are capable of respectively rotating around the slide shafts, are respectively located on the slide shafts.

In the above multipurpose protective and support device for a flat panel electronic equipment, every fastening head is a hemispheric elastic protrusion or an inclined elastic frame.

In the above multipurpose protective and support device for a flat panel electronic equipment, two guiding grooves or two guiding protrusions, which respectively incline towards the slide shafts, are respectively provided on a side wall of the locking slide slots; two inclining protrusions or two inclining grooves, which are respectively connected with the guiding grooves or the guiding protrusions, are respectively provided on the slide blocks.

In the above multipurpose protective and support device for a flat panel electronic equipment, a supporter is hinged with a front end or a rear end of the strip-shaped slide rail, and the supporter is long strip-shaped or plate-shaped.

In the above multipurpose protective and support device for a flat panel electronic equipment, a solar panel is located on the protective cover, the solar panel is connected with a power supply of the flat panel electronic equipment to provide a power for the power supply, a keyboard is located at an inner side of the protective cover.

In the above multipurpose protective and support device for a flat panel electronic equipment, the protective cover, the strip-shaped slide rails and the slide shafts are made of metal or plastic.

Compared with the prior arts, the present invention has beneficially technological effects as follows.

(1) The present invention is simple in structure, is able to utilize the turned protective cover as a supporter, or utilize the protective cover to provide a position for installing the keyboard, so as to achieve effects of taking the flat panel electronic equipment as a notebook computer, and randomly standing up the flat panel electronic equipment at any angle to convenient for watching.

(2) The protective cover of the present invention is able to protect the screen of the flat panel electronic equipment to avoid scratching.

(3) The protective cover of the present invention is capable of sliding to the back of the flat panel electronic equipment for fully retracting and hiding, so that no hindrance is produced while using, thereby the present invention has novel structural design.

(4) In the present invention, the solar battery is installed on the protective cover for charging, so that the energy consumption of the flat panel electronic equipment is reduced, thereby the present invention has an advantage of green energy conservation.

DETAILED DESCRIPTION OF THE PREFERRED EMBODIMENT

Figure 1:
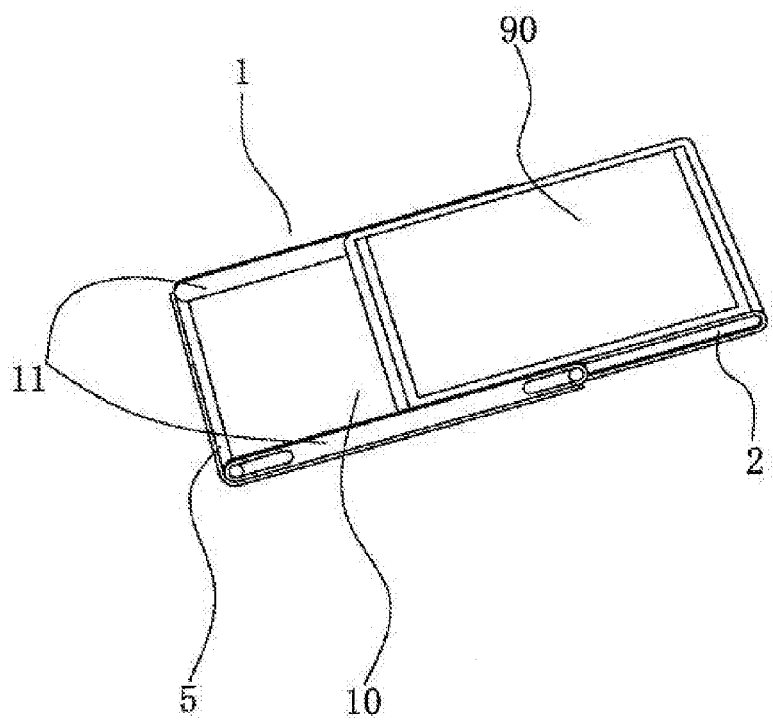
FIG. 1 shows a first using state of the present invention.

The present invention is further explained accompanying with drawings and embodiments as follows, as shown in FIGS. 1-16.

A multipurpose protective and support device for a flat panel electronic equipment, comprises: a protective cover 1 and two strip-shaped slide rails 2 respectively fixed at a left side and a right side of the flat panel electronic equipment 90, wherein the protective cover comprises a main panel 10, two side plates 11 are respectively located at a left side and a right side of the main panel, two side shafts 3 are respectively located at an inner side of one end of the side plates, the side shafts are respectively inserted into the strip-shaped slide rails, the slide shafts on the protective cover are able to respectively rotate or slide within the strip-shaped slide rails.

Figure 2:
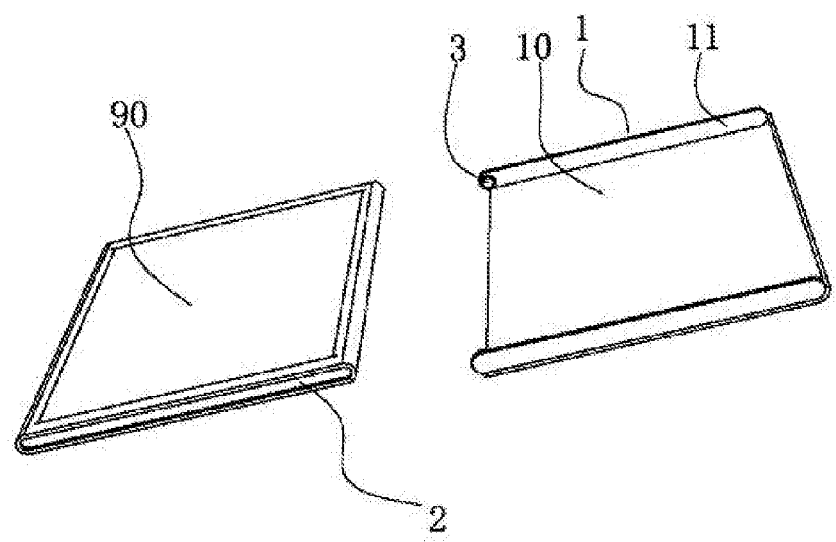
FIG. 2 is a structurally exploded view of FIG. 1.
Figure 3:
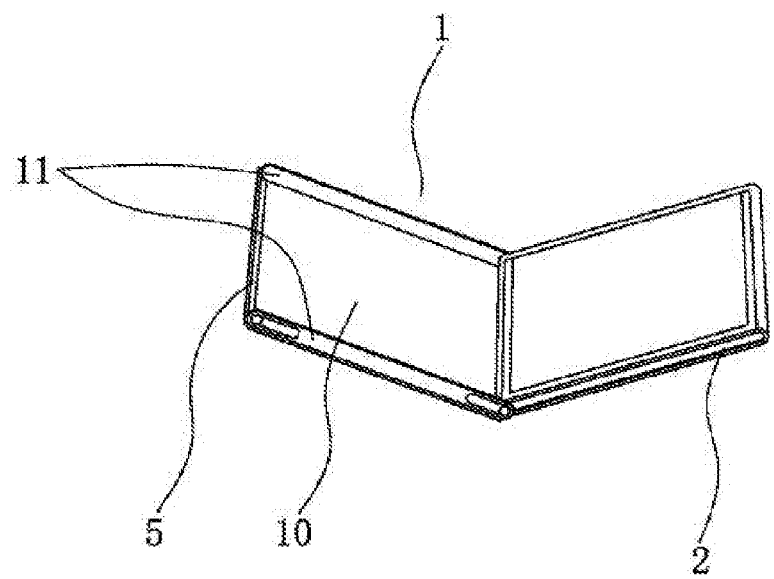
FIG. 3 shows a second using state of the present invention.

Referring to FIGS. 1, 2 and 3, FIG. 3 shows that the protective cover is open, the protective cover is continuously opened (by a rotation of the slide shafts within the slide rails), to be at a same plane with the flat panel electronic equipment, and simultaneously, the protective cover is able to be pushed (by the rotation of the slide shafts within the slide rails). FIG. 1 is a state diagram and shows that the protective cover is pushed to a half, and the protective cover is able to be pushed continuously till completely being pushed to a back of the flat panel electronic equipment. Compared with the prior arts, in the present invention, while using the flat panel electronic equipment, the protective cover is hidden well, thereby avoiding burdens from the prior arts during usage due to the protective cover.

A bent end cap 5 is located at a front side of the protective cover. An elastic clamping protrusion is located at an inner side of the end cap. While the protective cover covers the flat panel electronic equipment, the end cap is clamped with the flat panel electronic equipment to avoid automatically opening the protective cover.

Two locking mechanisms are respectively located at the side plates. For every locking mechanism (referring to FIGS. 11, 12, 13 and 14), the slide shaft 3 is located at the inner side of every side plate 11, two locking slide slots 7 are respectively provided at an outer side of the side plates, one end of a locking slide slot and a corresponding slide shaft are respectively located at two opposite sides of a corresponding side plate, two slide blocks 8 are respectively installed within the locking slide slots, two fastening heads 9, which are capable of respectively squeezing and contracting within the locking slide slots, are respectively located on the slide blocks; when one slide block slides to one end of the corresponding locking slide slot, the corresponding fastening head produces a rebounding force to squeeze the corresponding slide shaft for tightly clamping the corresponding strip-shaped slide rail. Every fastening head 9 is a hemispheric elastic protrusion or an inclined elastic frame. Two U-shaped notches 12 are respectively provided at an inner side of the side plates. Two press plates, which are capable of being respectively squeezed by the fastening heads 9 to incline inwardly, are respectively formed within the notches. The slide shafts are respectively located on the press plates, and two rollers 13, which are capable of respectively rotating around the slide shafts, are respectively located on the slide shafts.

Figure 11:
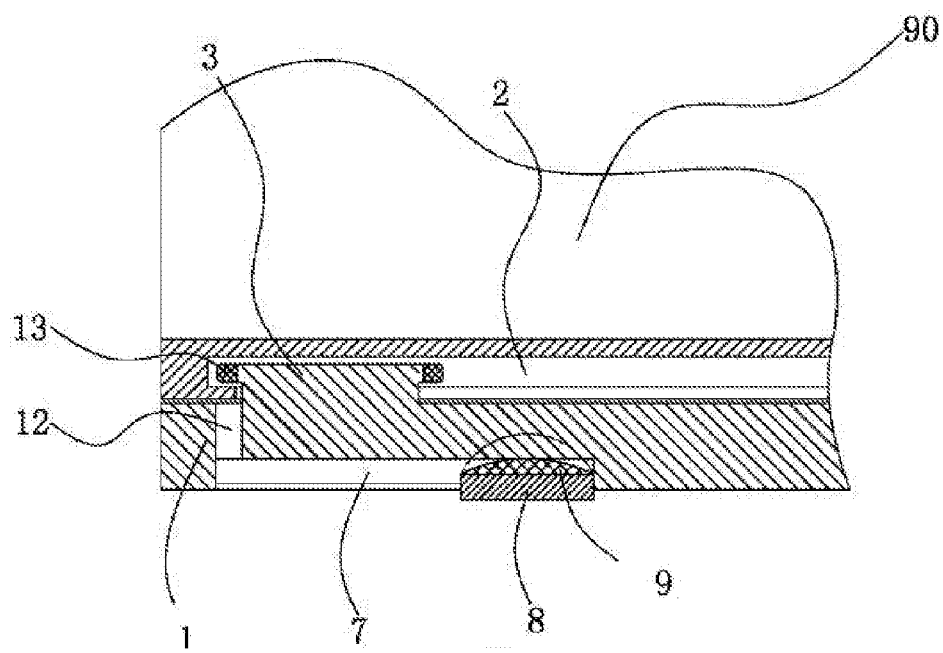
FIG. 11 is a first schematic diagram of a locking mechanism of the present invention.
Figure 12:
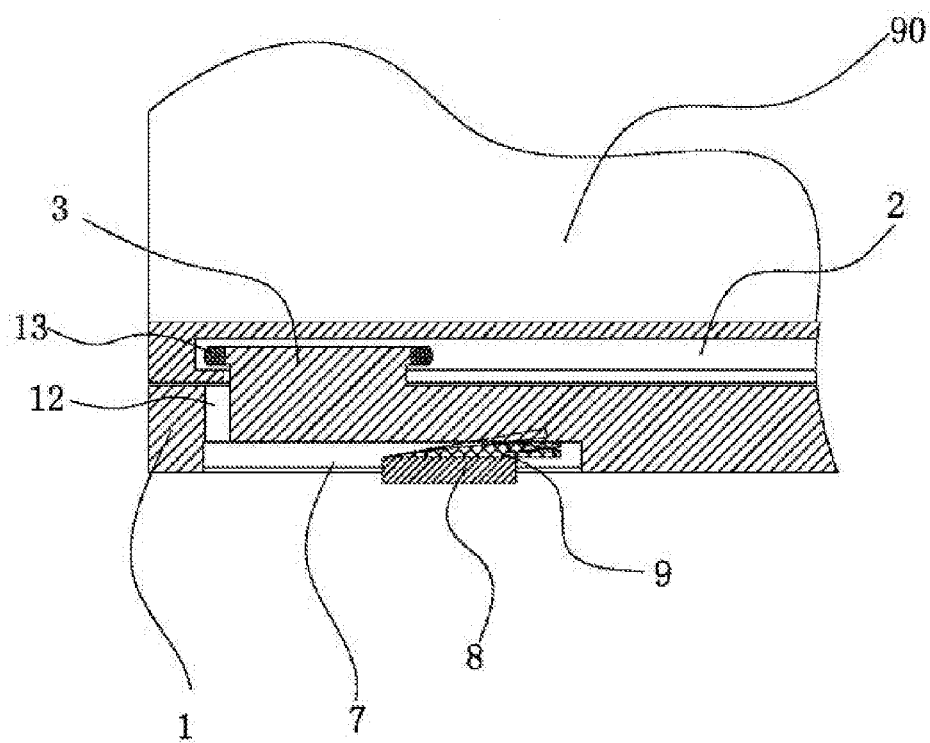
FIG. 12 is a second schematic diagram of a locking mechanism of the present invention.
Figure 13:
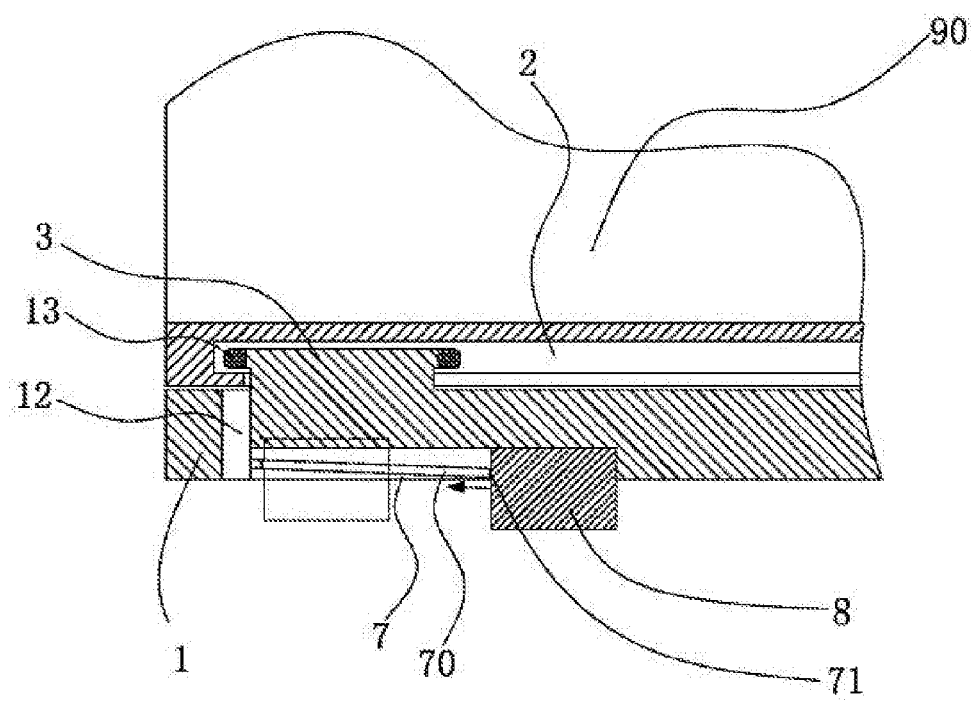
FIG. 13 is a third schematic diagram of a locking mechanism of the present invention.
Figure 14:
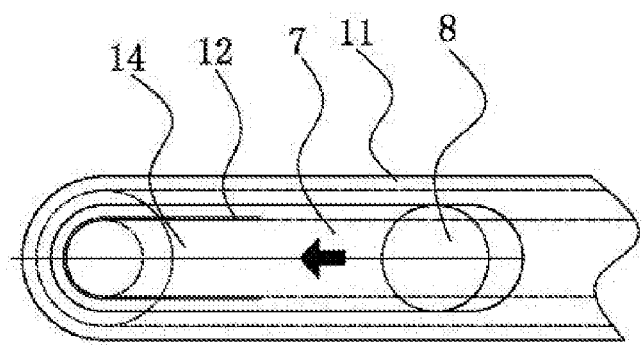
FIG. 14 is a fourth schematic diagram of a locking mechanism of the present invention.

In the above structure, an independently inwardly inclined press plate 14 is formed within every notch 12. The slide shafts are respectively fixed on the press plates. When one slide block slides to the corresponding press plate, the corresponding fastening head produces an elastic force to squeeze the corresponding press plate for inclining, so as to drive the corresponding slide shaft to tightly clamp the corresponding strip-shaped slide rail. The rollers 13 (as shown in FIGS. 11, 12 and 13), made of elastic materials, are respectively sleeved with the slide shafts to form a rotatable connecting structure, so as to avoid difficult sliding or producing noises.

Or, two guiding grooves 70 or two guiding protrusions, which respectively incline towards the slide shafts, are respectively provided on a side wall of the locking slide slots 7; two inclining protrusions 71 or two inclining grooves, which are slidably connected with the guiding grooves or the guiding protrusions, are respectively provided on the slide blocks 8. As shown in FIG. 13, one fastening head pushes leftwards to squeeze the corresponding press plate 14 for inclining.

Figure 4:
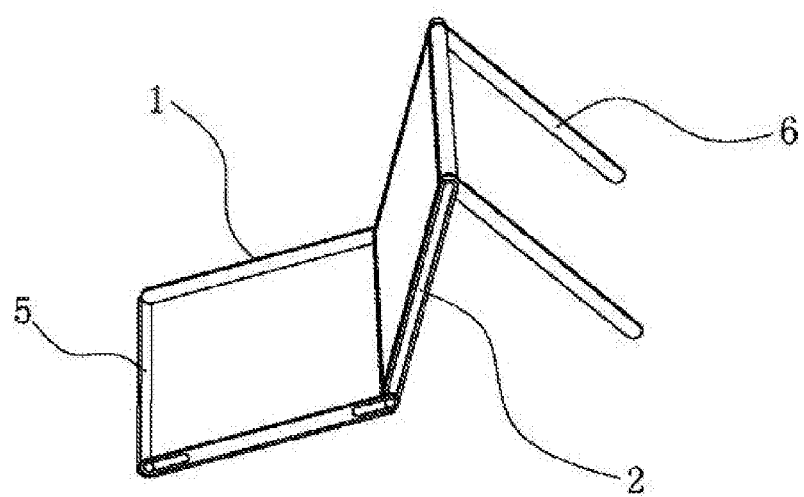
FIG. 4 is a using state diagram of a second structure of the present invention.
Figure 5:
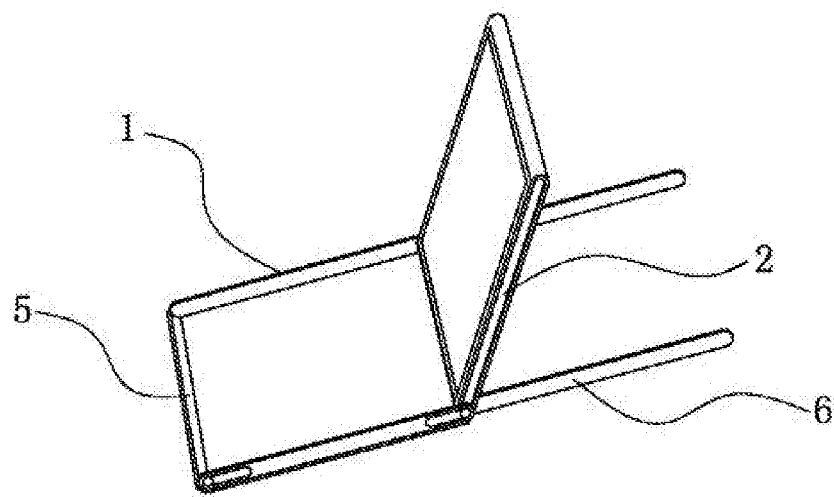
FIG. 5 is a using state diagram of a third structure of the present invention.

The second structure is similar to the third structure in the present invention, namely, a supporter 6 is hinged with a front end or a rear end of the strip-shaped slide rail, and the supporter is long strip-shaped or plate-shaped. Referring to FIGS. 4 and 5, the protective cover 1 is opened to have an angle of 120° with the flat panel electronic equipment, and the long strip-shaped supporter is opened. In the second structure, the support is located at an upper end of the strip-shaped slide rails for supporting the flat panel electronic equipment to avoid falling down. In the third structure, the support is located at a lower end of the strip-shaped slide rails for being in a horizontal state with the protective cover after opening the protective cover, so as to avoid falling down the flat panel electronic equipment.

Figure 6:
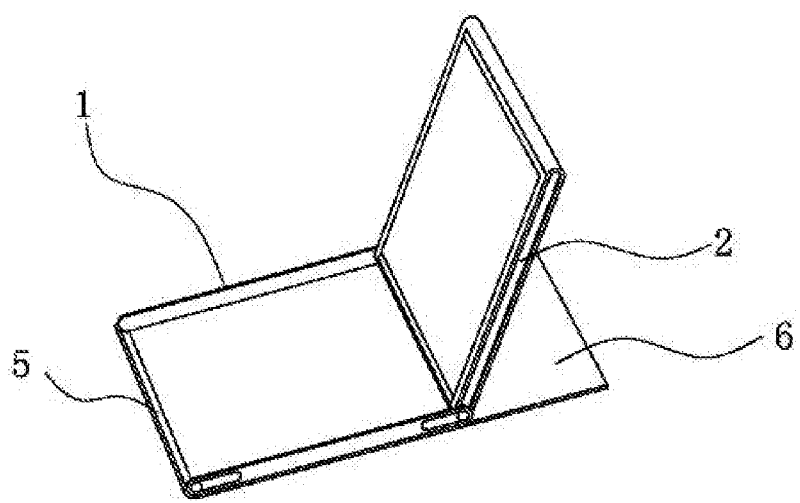
FIG. 6 is a using state diagram of a fourth structure of the present invention.

FIG. 6 shows the fourth structure. The support, having a plate shape, is hinged with the lower end of the strip-shaped slide rails, so as to avoid falling down the flat panel electronic equipment while opening the flat panel electronic equipment.

The second structure, the third structure and the fourth structure allow the flat panel electronic equipment to have a similar usage mode with the notebook computer, the keyboard is installed at the inner side of the opened protective cover, thereby facilitating operation.

Figure 7:
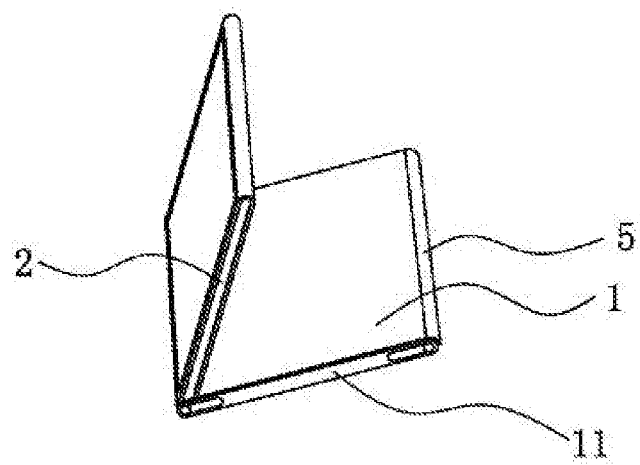
FIG. 7 shows a third using state of the present invention.

FIG. 7 is a using state diagram and shows the protective cover of the present invention rotates about 300° (referring to FIG. 3, which shows the protective cover continuously counterclockwise rotates), wherein the protective cover is used as the supporter after being rotated.

Figure 8:
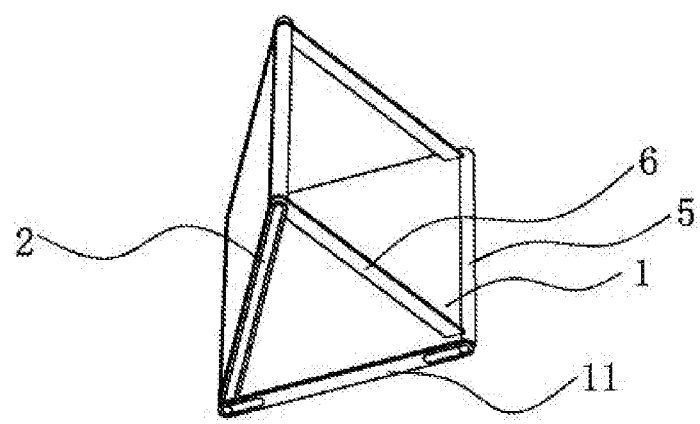
FIG. 8 shows a second using state of FIG. 4.

FIG. 8 is a using state diagram and shows the protective cover in FIG. 4 continuously counterclockwise rotates about 300°, wherein the supporter, the protective cover and the flat panel electronic equipment form a triangle for being placed smoothly and steadily.

Figure 9:
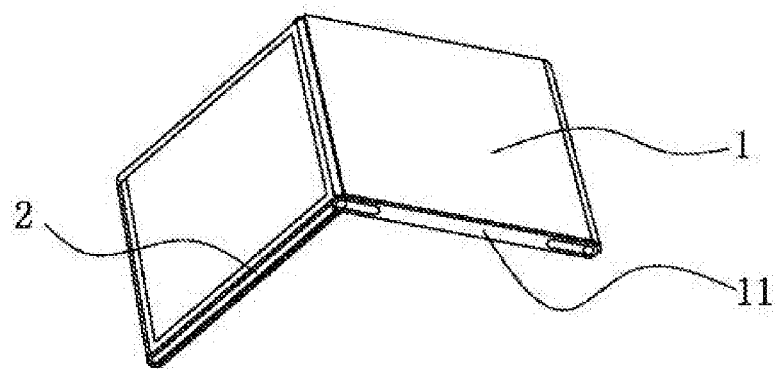
FIG. 9 shows a fourth using state of the present invention.
Figure 10:
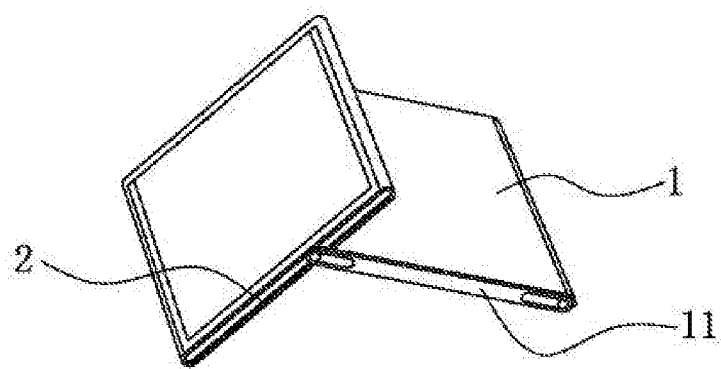
FIG. 10 shows a fifth using state of the present invention.

FIGS. 9 and 10 respectively show two using states which are able to be achieved by the locking mechanisms of the present invention. In FIG. 9, the protective cover 1 firstly rotates about 300°, and then is moved by the slide rails to an upper end of the flat panel electronic equipment, or is moved to a middle portion of the flat panel electronic equipment (as shown in FIG. 10), and then the protective cover and the slide rails are positioned by the locking mechanisms, so that the support which adopts the protective cover and the flat panel electronic equipment is achieved.

The using states in FIGS. 4, 5, 6, 7, 8, 9, and 10 are convenient for reading and watching, so that it is not necessary to hold all through the flat panel electronic equipment by hands, thereby resolving the problem that when the flat panel electronic equipment is placed on the table, people's sitting postures need to be changed for changing sight directions to clearly watch.

Figure 15:
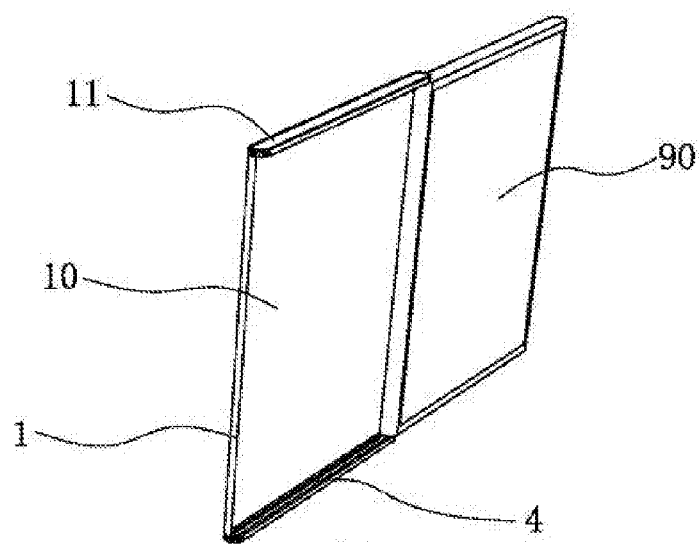
FIG. 15 is structurally schematic view of another embodiment of the present invention.
Figure 16:
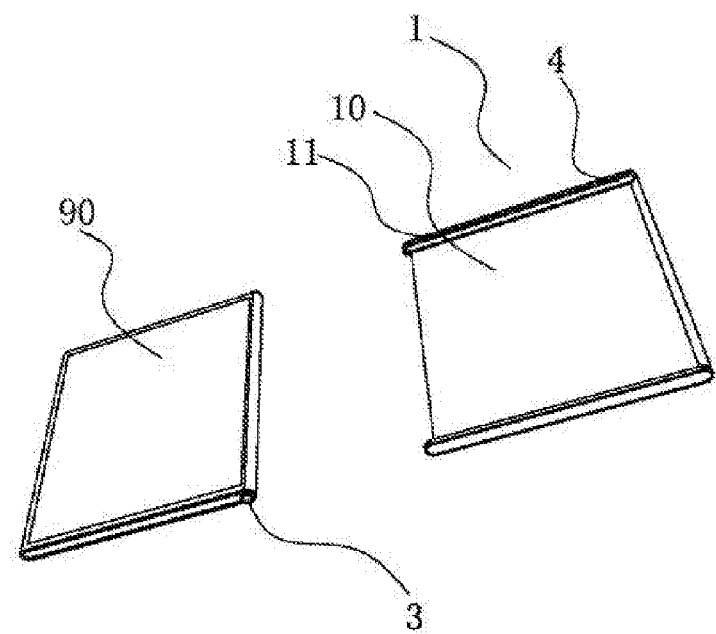
FIG. 16 is a structural exploded view of FIG. 15.

Referring to FIGS. 15 and 16, another embodiment of the present invention is shown. A multipurpose protective and support device for a flat panel electronic equipment, comprises: a protective cover and two slide shafts 3 respectively fixed at a left side and a right side of the flat panel electronic equipment, wherein the protective cover comprises a main panel 10, two side plates 11 are respectively located at a left side and a right side of the main panel, two strip-shaped slide grooves 4 are respectively provided at an inner side of the side plates, the side shafts are respectively inserted into the strip-shaped slide grooves, the slide shafts on the flat panel electronic equipment are able to respectively rotate or slide within the strip-shaped slide grooves. The structure has a similar principle with the above mentioned structures, namely, the strip-shaped slide grooves, respectively provided on the side plates, are used as the slide rails, the slide shafts are located on the flat panel electronic equipment. The working process of this embodiment is same as the above mentioned structures.

A solar panel is located on the protective cover, the solar panel is connected with a power supply of the flat panel electronic equipment to provide a power for the power supply, and a keyboard is located at an inner side of the protective cover.

The protective cover, the strip-shaped slide rails and the slide shafts are made of metal or plastic.

The above embodiments are preferred embodiments of the present invention, and not intended to limit a protective scope of the present invention. Therefore, all equivalent changes based on the structures, shapes and principles of this invention are completely contained within the protective scope thereof.

What is claimed is:

1. A multipurpose protective and support device for a flat panel electronic equipment, comprising: a protective cover and two strip-shaped slide rails respectively fixed at a left side and a right side of the flat panel electronic equipment, wherein:

the protective cover comprises a main panel, two side plates are respectively located at a left side and a right side of the main panel, two side shaft are respectively located at an inner side of one end of the two side plates, the side shafts are respectively inserted into the strip-shaped slide rails, the slide shafts on the protective cover are able to respectively rotate or slide within the strip-shaped slide rails, a bent end cap is located at a front side of the protective cover for elastically clamping with the flat panel electronic equipment.

2. The multipurpose protective and support device for the flat panel electronic equipment, as recited in claim 1, wherein the slide shafts are respectively located at the inner side of the side plates, two locking slide slots are respectively provided at an outer side thereof, one end of every locking slide slot and a corresponding slide shaft are respectively located at two opposite sides of a corresponding side plate, two slide blocks are respectively installed within the locking slide slots, two fastening heads, which are capable of respectively squeezing and contracting within the locking slide slots, are respectively located on the slide blocks; when one slide block slides to one end of a corresponding locking slide slot, a corresponding fastening head produces a rebounding force to squeeze a corresponding slide shaft for tightly clamping a corresponding strip-shaped slide rail, thereby a rotation or sliding of the corresponding slide shaft relatively to the corresponding strip-shaped slide rail is limited through a friction force.

3. The multipurpose protective and support device for the flat panel electronic equipment, as recited in claim 2, wherein every fastening head is a hemispheric elastic protrusion or an inclined elastic frame.

4. The multipurpose protective and support device for the flat panel electronic equipment, as recited in claim 3, wherein a supporter is hinged with a front end or a rear end of the strip-shaped slide rails, the supporter is long strip-shaped or plate-shaped.

5. The multipurpose protective and support device for the flat panel electronic equipment, as recited in claim 4, wherein the rollers are made of elastic materials.

6. The multipurpose protective and support device for the flat panel electronic equipment, as recited in claim 5, wherein the protective cover, the strip-shaped slide rails and the slide shafts are made of metal or plastic.

7. The multipurpose protective and support device for the flat panel electronic equipment, as recited in claim 2, wherein two U-shaped notches are respectively provided at an inner side of the side plates, two press plates, which are capable of being squeezed by the fastening heads or the slide blocks to incline inwardly, are respectively formed within the notches, the slide shafts are respectively located on the press plates, and two rollers, which are capable of respectively rotating around the slide shafts, are respectively located on the slide shaft.

8. The multipurpose protective and support device for the flat panel electronic equipment, as recited in claim 7, wherein a supporter is hinged with a front end or a rear end of the strip-shaped slide rails, the supporter is long strip-shaped or plate-shaped.

9. The multipurpose protective and support device for the flat panel electronic equipment, as recited in claim 8, wherein the rollers are made of elastic materials.

10. The multipurpose protective and support device for the flat panel electronic equipment, as recited in claim 9, wherein the protective cover, the strip-shaped slide rails and the slide shafts are made of metal or plastic.

11. The multipurpose protective and support device for the flat panel electronic equipment, as recited in claim 2, wherein a supporter is hinged with a front end or a rear end of the strip-shaped slide rails, the supporter is long strip-shaped or plate-shaped.

12. The multipurpose protective and support device for the flat panel electronic equipment, as recited in claim 1, wherein the slide shafts are respectively located at the inner side of the side plates, two locking slide slots are respectively provided at an outer side thereof, one end of every locking slide slot and a corresponding slide shaft are respectively located at two opposite sides of a corresponding side plate, two slide blocks are respectively installed within the locking slide slots, two guiding groove or two guiding protrusions, which respectively incline towards the slide shafts, are respectively provided on a side wall of the locking slide slots; two inclining protrusions or two inclining grooves, which are respectively connected with the guiding grooves or the guiding protrusions, are respectively located on the slide blocks.

13. The multipurpose protective and support device for the flat panel electronic equipment, as recited in claim 12, wherein two U-shaped notches are respectively provided at an inner side of the side plates, two press plates, which are capable of being squeezed by the fastening heads or the slide blocks to incline inwardly, are respectively formed within the notches, the slide shafts are respectively located on the press plates, and two rollers, which are capable of respectively rotating around the slide shafts, are respectively located on the slide shaft.

14. The multipurpose protective and support device for the flat panel electronic equipment, as recited in claim 13, wherein a supporter is hinged with a front end or a rear end of the strip-shaped slide rails, the supporter is long strip-shaped or plate-shaped.

15. The multipurpose protective and support device for the flat panel electronic equipment, as recited in claim 14, wherein the rollers are made of elastic materials.

16. The multipurpose protective and support device for the flat panel electronic equipment, as recited in claim 15, wherein the protective cover, the strip-shaped slide rails and the slide shafts are made of metal or plastic.

17. The multipurpose protective and support device for the flat panel electronic equipment, as recited in claim 12, wherein a supporter is hinged with a front end or a rear end of the strip-shaped slide rails, the supporter is long strip-shaped or plate-shaped.

18. The multipurpose protective and support device for the flat panel electronic equipment, as recited in claim 17, wherein the rollers are made of elastic materials.

19. The multipurpose protective and support device for the flat panel electronic equipment, as recited in claim 18, wherein the protective cover, the strip-shaped slide rails and the slide shafts are made of metal or plastic.

20. The multipurpose protective and support device for the flat panel electronic equipment, as recited in claim 1, wherein a supporter is hinged with a front end or a rear end of the strip-shaped slide rails, the supporter is long strip-shaped or plate-shaped.

* * * * *